United States Patent
Cho et al.

(10) Patent No.: US 8,932,705 B2
(45) Date of Patent: *Jan. 13, 2015

(54) THERMOSETTING RESIN COMPOSITION AND BOARD USING THE SAME

(75) Inventors: Chung-Kun Cho, Suwon-si (KR); Myung-Sup Jung, Seongnam-si (KR); Kwang-Hee Kim, Seoul (KR); Jae-Jun Lee, Suwon-si (KR); Kalinina Fedosya, Ulan-Ude (RU); Mahn Jong Kim, Yuseong-gu (JP); Chung Won Park, Yuseong-gu (KR)

(73) Assignee: Samsung Electro-Mechanics Co., Ltd. (KR)

( * ) Notice: Subject to any disclaimer, the term of this patent is extended or adjusted under 35 U.S.C. 154(b) by 1317 days.

This patent is subject to a terminal disclaimer.

(21) Appl. No.: 12/645,967

(22) Filed: Dec. 23, 2009

(65) Prior Publication Data

US 2010/0159231 A1  Jun. 24, 2010

(30) Foreign Application Priority Data

Dec. 24, 2008 (KR) .................. 10-2008-0133800
Dec. 8, 2009 (KR) .................. 10-2009-0121466

(51) Int. Cl.
| | | |
|---|---|---|
| *B32B 3/26* | (2006.01) | |
| *B32B 15/08* | (2006.01) | |
| *C08K 7/22* | (2006.01) | |
| *C08K 7/24* | (2006.01) | |
| *C08K 7/26* | (2006.01) | |
| *H05K 1/03* | (2006.01) | |
| *C08K 7/28* | (2006.01) | |
| *C08K 5/1515* | (2006.01) | |
| *C08K 5/3415* | (2006.01) | |

(52) U.S. Cl.
CPC ............... *H05K 1/0373* (2013.01); *C08K 7/28* (2013.01); *C08K 5/1515* (2013.01); *C08K 5/3415* (2013.01); *H05K 2201/0209* (2013.01); *H05K 2201/0254* (2013.01)

USPC ........ 428/313.3; 428/457; 428/458; 523/218; 523/219

(58) Field of Classification Search
None
See application file for complete search history.

(56) References Cited

U.S. PATENT DOCUMENTS

| | | | | |
|---|---|---|---|---|
| 4,579,916 | A * | 4/1986 | Schmid et al. | 525/502 |
| 4,678,849 | A * | 7/1987 | Liu et al. | 526/259 |
| 5,780,145 | A * | 7/1998 | Hirano et al. | 428/323 |
| 6,962,965 | B2 * | 11/2005 | Yeager | 528/205 |
| 2003/0045804 | A1 | 3/2003 | Brodnick | |
| 2006/0074151 | A1 * | 4/2006 | He et al. | 523/457 |
| 2010/0124037 | A1 * | 5/2010 | Jung et al. | 361/783 |

FOREIGN PATENT DOCUMENTS

JP   2007154169   6/2007

OTHER PUBLICATIONS

Fumed Silica, Wikipedia , [online]; [retrieved on Jun. 5, 2014]; retrieved from the internet http://en.wikipedia.org/wiki/Fumed silica.

* cited by examiner

*Primary Examiner* — Monique Jackson
(74) *Attorney, Agent, or Firm* — Cantor Colburn LLP

(57) ABSTRACT

Disclosed is a thermosetting resin composition including a thermosetting aromatic oligomer represented by the following Chemical Formula 1, a hollow particle, and solvent, and a board comprising the same.

Chemical Formula 1

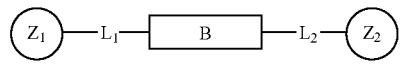

In the above Chemical Formula 1, wherein B, $L_1$, $L_2$, $Z_1$ and $Z_2$ are the same as in defined in the specification.

16 Claims, 1 Drawing Sheet

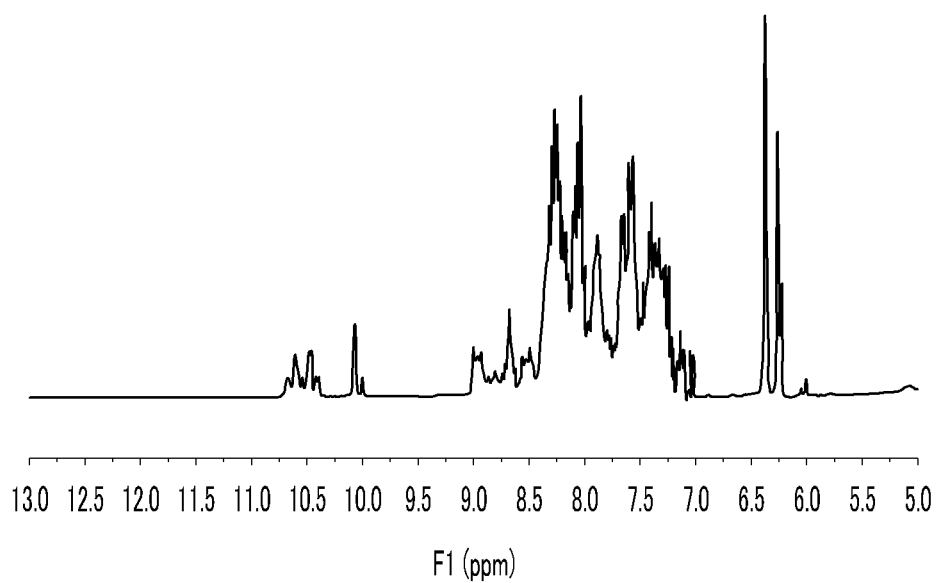

THERMOSETTING RESIN COMPOSITION AND BOARD USING THE SAME

This application claims priority to Korean Patent Application No. 10-2008-0133800, filed on Dec. 24, 2008 and Korean Patent Application Nos. 10-2009-0121466 filed on Dec. 8, 2009, and all the benefits accruing therefrom under 35 U.S.C. §119, the contents of which in their entirety are herein incorporated by reference.

BACKGROUND

1. Field

This disclosure relates generally to a thermosetting resin composition and a printed circuit board using the same.

2. Description of the Related Art

For developing information and communication technology, a computer and a communicational device are often integrated in to a single electronic device. As electronic devices, such as a portable telephone, a personal telephone, or the like, are down-sized, the printed circuit board, which is a fundamental element for them, is developed to have higher density. Producing high density printed circuit boards can achieved by multilayering and decreasing a thickness of board, a diameter of through-hole, and a distance between hole gaps, which requires a board material having higher performance.

SUMMARY

One embodiment provides a thermosetting resin composition having low thermal expansion coefficient and dielectric constant.

In another embodiment, this disclosure provides a resin cured product using the thermosetting resin composition.

In another embodiment, this disclosure provides a board using the thermosetting resin composition.

According to one embodiment, a thermosetting resin composition is provided that includes a thermosetting aromatic oligomer represented by Chemical Formula 1, a hollow particle, and a solvent.

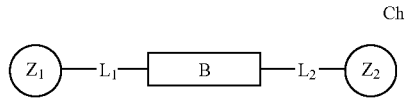

Chemical Formula 1

In the above Chemical Formula 1, B is a main chain including a repeating unit represented by the following Chemical Formula 2, $L_1$ and $L_2$ are linking groups, $Z_1$ and $Z_2$ are a thermosetting functional group including a multiple bond at a terminal end or a hydroxyl group.

Chemical Formula 2

In the above Chemical Formula 2, $A_1$ is an aromatic cyclic group including at least one arylene represented by Chemical Formulas 3-1 to 3-5, $X_1$ and $Y_1$ are independently COO, O, CNR', CONR", NR''', or CO, where R', R", and R''' are independently hydrogen, a substituted or unsubstituted C1 to C20 alkyl, or a substituted or unsubstituted C6 to C30 aryl, and $k_1$ is an integer ranging from 1 to 50.

In one embodiment, $A_1$ in Chemical Formula 2 may include at least one arylene represented by the following Chemical Formulas-1 to 3-5, and at least one arylene represented by Chemical Formula 5-1 to 5-4.

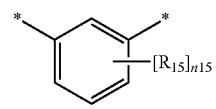

Chemical Formula 3-1

Chemical Formula 3-2

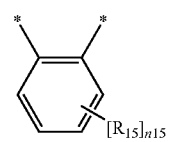

In the above Chemical Formulas 3-1 and 3-2, $n_{15}$ is an integer ranging from 0 to 4, $R_{15}$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ is 2 or more, the substituent is the same or different from each other, and the aromatic cyclic group includes a heteroatom selected from N, O, S, or P.

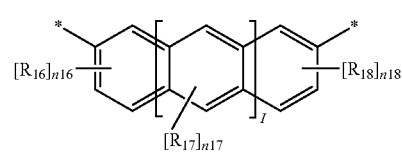

Chemical Formula 3-3

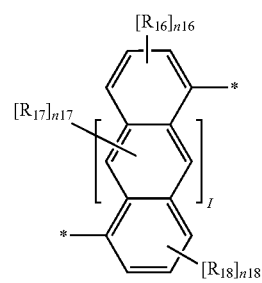

Chemical Formula 3-4

In the above Chemical Formulas 3-3 and 3-4, $n_{16}$ and $n_{18}$ are independently integers ranging from 0 to 3, $n_{17}$ is an integer ranging from 0 to 2, $R_{16}$, $R_{17}$ and $R_{18}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{16}$ to $n_{18}$ are 2 or more, the substituents are the same or different from each other, $l$ is an integer ranging from 0 to 3, and the aromatic cyclic group includes a heteroatom selected from N, O, S, or P.

Chemical Formula 3-5

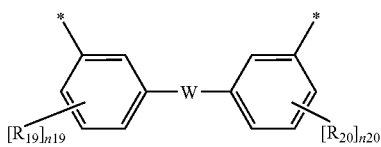

In the above Chemical Formula 3-5, $n_{19}$ and $n_{20}$ are independently integers ranging from 0 to 4, $R_{19}$ and $R_{20}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{19}$ and $n_{20}$ are 2 or more, the substituents are the same or different from each other, W is a single bond, O, S, CO, $SO_2$, $N_2$, a substituted or unsubstituted C1 to C20 alkylene, a substituted or unsubstituted C1 to C20 alkoxylene, a substituted or unsubstituted C6 to C30 arylene, a substituted or unsubstituted C6 to C30 oxyarylene, a substituted or unsubstituted C6 to C30 heteroarylene, a substituted or unsubstituted C6 to C30 oxyheteroarylene, CONR', or a linking group represented by the following Chemical Formulas 4-1 to 4-7, where R and R' are independently hydrogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and the aromatic cyclic group includes a heteroatom selected from N, O, S, or P.

Chemical Formula 4-1

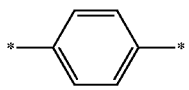

Chemical Formula 4-2

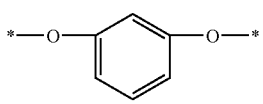

Chemical Formula 4-3

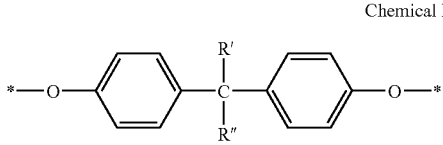

Chemical Formula 4-4

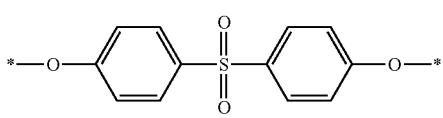

Chemical Formula 4-5

Chemical Formula 4-6

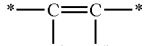

Chemical Formula 4-7

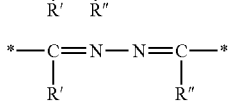

In the above Chemical Formulas 4-3, 4-5, 4-6, and 4-7,

R, R' and R'' are independently hydrogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy.

Chemical Formula 5-1

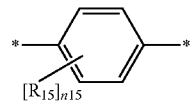

Chemical Formula 5-2

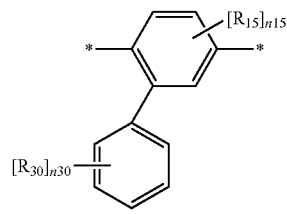

In the above Chemical Formula 5-2, $n_{15}$ is an integer ranging from 0 to 4, $n_{30}$ is an integer ranging from 0 to 5, $R_{15}$ and $R_{30}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ and $n_{30}$ are 2 or more, the substituents are the same or different from each other, and the aromatic cyclic group includes a heteroatom selected from N, O, S, or P.

Chemical Formula 5-3

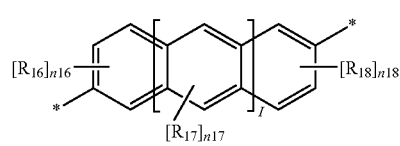

Chemical Formula 5-4

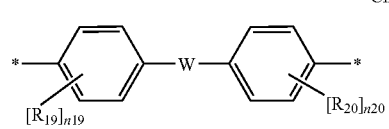

In the above Chemical Formula 5-1, 5-3, and 5-4, $n_{15}$ to $n_{20}$, $n_{30}$, $R_{15}$ to $R_{20}$, $R_{30}$, and W are the same as defined in the above Chemical Formulas 3-1 to 3-5.

In one embodiment, B in the above Chemical Formula 1 may include a structure unit represented by the following Chemical Formula 6.

Chemical Formula 6

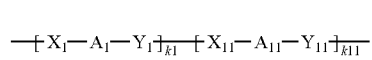

In the above Chemical Formula 6, $A_1$ is selected from arylene represented by the above Chemical Formulas 3-1 to 3-5, $A_{11}$ is selected from arylene represented by the above Chemical Formulas 5-1 to 5-4, $X_1$ and $X_{11}$ and $Y_1$ and $Y_{11}$ are independently COO, O, CNR', CONR'', NR''', or CO, where R', R'', and R''' are independently hydrogen, a substituted or unsubstituted C1 to C20 alkyl, or a substituted or unsubstituted C6 to C30 aryl, and $k_1$ and $k_{11}$ are integers ranging from 1 to 50.

In one embodiment, $Z_1$ and $Z_2$ in the above Chemical Formula 1 are independently hydroxy, maleimide, nadimide, phthalimide, alkenyl, alkynyl, propargyl ether, benzocyclobutene, cyanate, a substituted or unsubstituted C3 to C30 alicyclic group including a double bond or a triple bond, a C6 to C30 aryl including a C2 to C30 alkenyl or a C2 to C30 alkynyl, or a C6 to C30 aryl including cyanide group, or independently selected from thermosetting functional groups represented by the following Chemical Formulas 8-1 to 8-11.

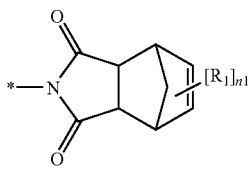

Chemical Formula 8-1

In the above Chemical Formula 8-1,
$n_1$ is an integer ranging from 0 to 6, and
$R_1$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_1$ is 2 or more, the substituent is the same or different from each other.

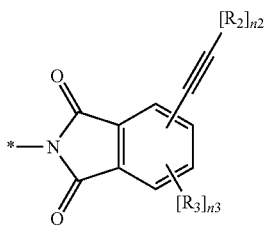

Chemical Formula 8-2

In the above Chemical Formula 8-2,
$n_2$ is 1, $n_3$ is an integer ranging from 0 to 3, and
$R_2$ and $R_3$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, when $n_3$ is 2 or more, the substituents are the same or different from each other.

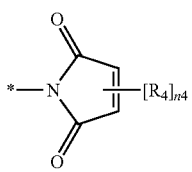

Chemical Formula 8-3

In the above Chemical Formula 8-3,
$n_4$ is an integer ranging from 0 to 2, and
$R_4$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_4$ is 2 or more, the substituent is the same or different from each other.

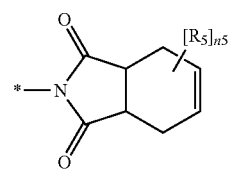

Chemical Formula 8-4

In the above Chemical Formula 8-4,
$n_5$ is an integer ranging from 0 to 8, and
$R_5$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_5$ is 2 or more, the substituent is the same or different from each other.

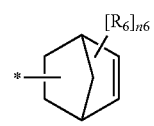

Chemical Formula 8-5

In the above Chemical Formula 8-5,
$n_6$ is an integer ranging from 0 to 7, and
$R_6$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_6$ is 2 or more, the substituent is the same or different from each other.

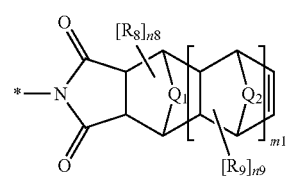

Chemical Formula 8-6

In the above Chemical Formula 8-6,
$n_8$ and $n_9$ are independently integers ranging from 0 to 6,
$R_8$ and $R_9$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when each $n_8$ and $n_9$ are 2 or more, the substituents are the same or different from each other,
$Q_1$ and $Q_2$ are independently methylene, O, or S, and
$m_1$ is an integer ranging from 1 to 3.

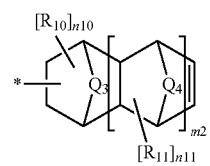

Chemical Formula 8-7

In the above Chemical Formula 8-7, $n_{10}$ is an integer ranging from 0 to 7, $n_{11}$ is an integer ranging from 0 to 6, $R_{10}$ and $R_{11}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{10}$ and $n_{11}$ are independently 2 or more, the substituents are the same or different from each other, $Q_3$ and $Q_4$ are independently methylene, O, or S, and $m_2$ is an integer ranging from 1 to 3.

Chemical Formula 8-8

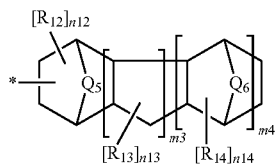

In the above Chemical Formula 8-8, $n_{12}$ is an integer ranging from 0 to 7, $n_{13}$ is an integer ranging from 0 to 6, $n_{14}$ is an integer ranging from 0 to 8, $R_{12}$ to $R_{14}$ are independently substituents selected from y hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and $n_{12}$ to $n_{14}$ are 2 or more, the substituents are the same or different from each other, $Q_5$ and $Q_6$ are independently methylene, O, or S, and $m_3$ and $m_4$ are independently integers ranging from 1 to 3.

Chemical Formula 8-9

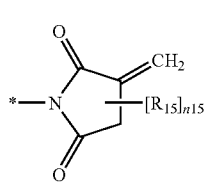

In the above Chemical Formula 8-9, $n_{15}$ is an integer ranging from 0 to 2, $R_{15}$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ is 2, the substituent is the same or different from each other.

Chemical Formula 8-10

*—C≡CH

Chemical Formula 8-11

*—C≡N

The repeating unit of the above Chemical Formula 2 is included in an amount of more than about 5 mol % to about 70 mol % or less based on the total moles of the main chain of the thermosetting aromatic oligomer.

The thermosetting aromatic oligomer has a number average molecular weight of about 500 to about 15,000, and is included in an amount of about 10 to about 75 wt % based on the total weight of the thermosetting resin composition.

In one embodiment, the hollow particle may include a porous inorganic material, a porous organic material, a porous organic-inorganic composite material, or a combination thereof. The porous inorganic material may be made using alumina, silica, fused silica, glass, or a combination thereof, and the porous organic material may be made using a urea resin, a phenol resin, or a combination thereof.

In one embodiment, the hollow particle may include aerogel. The aerogel may be obtained from silica, an organic polymer, alumina, platinum, nickel, titania, zirconia, ruthenium, cobalt, or a combination thereof.

In one embodiment, the hollow particle may be included in an amount of about 0.5 to about 70 volume % based on the total volume of the thermosetting aromatic oligomer and hollow particle, and the hollow particle has a size of about 0.1 to about 100 μm.

In one embodiment, the thermosetting resin composition may further include a maleimide-based compound.

According to another embodiment of this disclosure, a resin cured product using the thermosetting resin composition is provided.

According to another embodiment of this disclosure, a board is provided that includes the resin cured product; and a reinforcing material, and the resin cured product is impregnated into the reinforcing material and attached thereto, or disposed on the surface of the reinforcing material.

In one embodiment, the board further includes a metal foil being bound with at least one side of the resin cured product.

Hereinafter, further aspects will be described in detail.

BRIEF DESCRIPTION OF THE DRAWING

Exemplary embodiments of the invention can be understood in more detail from the following descriptions taken in conjunction with the accompanying drawings, in which:

FIG. 1 is a graph showing $^1$H-NMR of an exemplary thermosetting aromatic oligomer according to Example 1.

DETAILED DESCRIPTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The modifier "about" used in connection with a quantity is inclusive of the stated value and has the meaning dictated by the context (e.g., includes the degree of error associated with measurement of the particular quantity).

Hereinafter, when a definition is not otherwise provided, the term "substituted" refers to one substituted with halogen, a C1 to C20 alkyl, a C1 to C20 haloalkyl, a C1 to C20 alkoxy, a C6 to C30 aryl, or a C6 to C30 aryloxy.

Hereinafter, when a definition is not otherwise provided, the terms "alkyl", "alkenyl", "alkynyl", "alkylene", "alkenylene", "alkynylene", "cycloalkylene", "cycloalkenylene", "cycloalkynylene", "alkoxy" and "alkoxylene" refer to a C1 to C20 alkyl, a C2 to C20 alkenyl, a C2 to C20 alkynyl, a C1 to C20 alkylene, a C2 to C20 alkenylene, a C2 to C20 alkynylene, a C3 to C20 cycloalkylene, a C3 to C20 cycloalkenylene, a C3 to C20 cycloalkynylene, a C1 to C20 alkoxy, and a C1 to C20 alkoxylene, respectively, and the terms "aryl", "arylene", "aryloxy" and "oxyarylene" refer to a C6 to C30 aryl, a C6 to C30 arylene, a C6 to C30 aryloxy, and a C6 to C30 oxyarylene.

Hereinafter, when a definition is not otherwise provided, the terms "heteroarylene" and "oxyheteroarylene" refer to a heteroarylene and an oxyheteroarylenearylene including a heteroatom N, O, S, or P in a cycle. The terms "heterocycloalkyl" "heterocycloalkylene", "heterocycloalkenyl", "heterocycloalkenylene", "heterocycloalkynyl" and "heterocycloalkynylene" refer to a heterocycloalkyl, a heterocycloalkylene, a heterocycloalkenyl, a heterocycloalkenylene, a heterocycloalkynyl, and a heterocycloalkynylene including heteroatoms selected from N, O, S, or P in a cycloalkyl ring, a cycloalkylene ring, a cycloalkenyl ring, a cycloalkenylene ring, a cycloalkynyl ring, and a cycloalkynylene ring.

Hereinafter, when a definition is not otherwise provided, the term "(meth)acrylate" refers to "acrylate" and "methacrylate", the term "epoxy(meth)acrylate" refers to "epoxyacrylate" and "epoxymethacrylate", the term "di(meth)acryloxy-bisphenol" refers to "diacryloxy-bisphenol" and "dimethacryloxy-bisphenol", and the term "poly(meth)acrylate" refers to "acrylate" and "methacrylate".

Hereinafter, when a definition is not otherwise provided, the term "alicyclic group" refers to a C3 to C30 cycloalkyl, a C3 to C30 cycloalkynyl, a C3 to C30 cycloalkenyl, a C3 to C30 heterocycloalkyl, a C3 to C30 heterocycloalkynyl, a C3 to C30 heterocycloalkenyl and the like.

Hereinafter, when a definition is not otherwise provided, the term "aromatic cyclic group" refers to a mixed cycle structure including unsaturated bonds, lone pairs electrons, and the like, and a functional group having electron delocalization or resonance structure.

Hereinafter, when a definition is not otherwise provided, a "*" indicates a point of attachment.

In one embodiment, a thermosetting resin composition includes a thermosetting aromatic oligomer, a hollow particle, and a solvent. Hereinafter, each component will be described in detail.

Thermosetting Aromatic Oligomer

In one embodiment, the thermosetting aromatic oligomer is an oligomer including an aromatic cyclic group in a main chain, and may be represented by the following Chemical Formula 1.

Chemical Formula 1

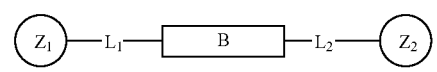

In the above Chemical Formula 1,

B is a main chain including a repeating unit represented by the following Chemical Formula 2, $L_1$ and $L_2$ are linking groups, and $Z_1$ and $Z_2$ are a thermosetting functional group including a multiple bond at a terminal end or a hydroxyl group, Chemical Formula 2

In the above Chemical Formula 2, $A_1$ is a substituted or unsubstituted aromatic cyclic group, $X_1$ and $Y_1$ are independently COO, O, CNR', CONR", NR''', or CO, where R', R", and R''' are independently hydrogen, a substituted or unsubstituted C1 to C20 alkyl, or a substituted or unsubstituted C6 to C30 aryl, and $k_1$ is an integer ranging from 1 to 50.

In one embodiment, the aromatic cyclic group $A_1$ in the above Chemical Formula 2 includes a C5 to C20 cycloalkenylene, a C4 to C20 heterocycloalkenylene, a C6 to C30 arylene, a C2 to C30 heteroarylene, a C2 to C30 heteroaryloxylene, and the like. The main chain may include at least two aromatic cyclic group being different from each other.

In one embodiment, the aromatic cyclic group $A_1$ in the above Chemical Formula 2 may include at least one arylene represented by the following Chemical Formulas 3-1 to 3-5. In another embodiment, the aromatic cyclic group $A_1$ in the above Chemical Formula 2 may include at least one arylene represented by the following Chemical Formula 3-1 to 3-5, and at least one arylene represented by the following Chemical Formulas 5-1 to 5-4.

The arylene represented by Chemical Formulas 3-1 to 3-5 may be included in an amount of about 5 to about 60 mol %, or about 10 to about 50 mol % based on the total moles of the thermosetting aromatic oligomer. When the arylene is within the above range, solubility in a solvent may be improved, and desirable viscosity may be obtained.

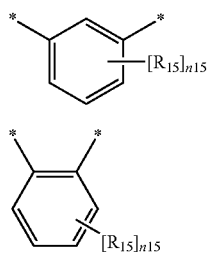

Chemical Formula 3-1

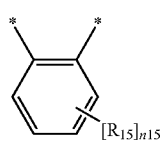

Chemical Formula 3-2

In the above Chemical Formulas 3-1 and 3-2, $n_{15}$ is an integer ranging from 0 to 4, $R_{15}$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ is 2 or more, the substituent is the same or different from each other, and the aromatic cyclic group includes a heteroatom selected from N, O, S, or P.

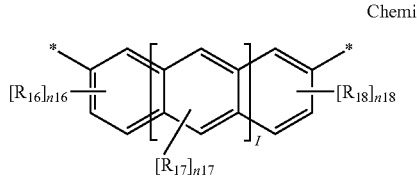

Chemical Formula 3-3

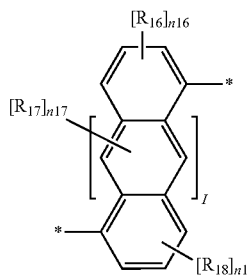

Chemical Formula 3-4

In the above Chemical Formulas 3-3 and 3-4, $n_{16}$ and $n_{18}$ are independently integers ranging from 0 to 3, $n_{17}$ is an integer ranging from 0 to 2, $R_{16}$, $R_{17}$ and $R_{18}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{16}$ to $n_{18}$ are 2 or more, the substituents are the same or different from each other, I is an integer ranging from 0 to 3, and, the aromatic cyclic group includes a heteroatom selected from N, O, S, or P.

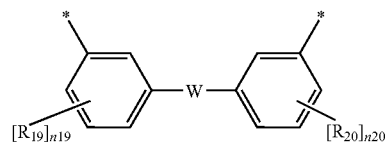

Chemical Formula 3-5

In the above Chemical Formula 3-5, $n_{19}$ and $n_{20}$ are independently integers ranging from 0 to 4, $R_{19}$ and $R_{20}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{19}$ and $n_{20}$ are 2 or more, the substituents are the same or different from each other, W is a single bond, O, S, CO, $SO_2$, $N_2$, a substituted or unsubstituted C1 to C20 alkylene, a substituted or unsubstituted C1 to C20 alkoxylene, a substituted or unsubstituted C6 to C30 arylene, a substituted or unsubstituted C6 to C30 oxyarylene, a substituted or unsubstituted C6 to C30 heteroarylene, a substituted or unsubstituted C6 to C30 oxyheteroarylene, CONR', or a linking group represented by the following Chemical Formula 4-1 to 4-7, where R and R' are independently hydrogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and the aromatic cyclic group includes a heteroatom selected from N, O, S, or P.

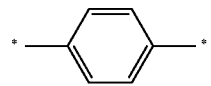

Chemical Formula 4-1

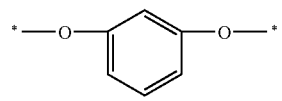

Chemical Formula 4-2

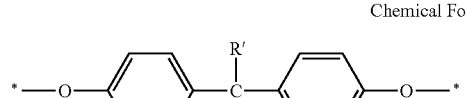

Chemical Formula 4-3

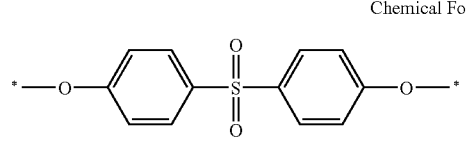

Chemical Formula 4-4

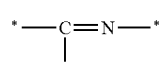

Chemical Formula 4-5

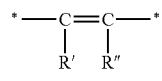

Chemical Formula 4-6

Chemical Formula 4-7

$$*-\underset{R'}{C}=N-N=\underset{R''}{C}-*$$

In the above Chemical Formulas 4-3, 4-5, 4-6, and 4-7,

R, R' and R" are independently hydrogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy.

Chemical Formula 5-1

[structure: para-disubstituted benzene with $[R_{15}]_{n15}$]

Chemical Formula 5-2

[structure: biphenyl with $[R_{15}]_{n15}$ and $[R_{30}]_{n30}$]

In the above Chemical Formula 5-2, $n_{15}$ is an integer ranging from 0 to 4, $n_{30}$ is an integer ranging from 0 to 5, $R_{15}$ and $R_{30}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ and $n_{30}$ are 2 or more, the substituents are the same or different from each other, and the aromatic cyclic group includes a heteroatom selected from N, O, S, or P.

Chemical Formula 5-3

[structure: anthracene-like with $[R_{16}]_{n16}$, $[R_{17}]_{n17}$, $[R_{18}]_{n18}$]

Chemical Formula 5-4

[structure: two phenyl rings connected by W, with $[R_{19}]_{n19}$ and $[R_{20}]_{n20}$]

In the above Chemical Formula 5-1, 5-3, and 5-4, $n_{15}$ to $n_{20}$, $n_{30}$, $R_{15}$ to $R_{20}$, $R_{30}$, and W are the same as defined in the above Chemical Formulas 3-1 to 3-5.

In one embodiment, B in the above Chemical Formula 1 may include a structure unit represented by the following Chemical Formula 6.

Chemical Formula 6

$$-(X_1-A_1-Y_1)_{k_1}-(X_{11}-A_{11}-Y_{11})_{k_{11}}-$$

In the above Chemical Formula 6, $A_1$ is selected from arylene represented by the above Chemical Formulas 3-1 to 3-5, $A_{11}$ is selected from arylene represented by the above Chemical Formulas 5-1 to 5-4, $X_1$ and $X_{11}$ and $Y_1$ and $Y_{11}$ are independently COO, O, CNR', CONR", NR'", or CO, where R', R", and R'" are independently hydrogen, a substituted or unsubstituted C1 to C20 alkyl, or a substituted or unsubstituted C6 to C30 aryl, and $k_1$ and $k_{11}$ are integers ranging from 1 to 50.

In one embodiment, the repeating unit represented by the above Chemical Formula 2 includes one of repeating units represented by the following Chemical Formulas 7-1 to 7-3.

Chemical Formula 7-1

$$-\left[\underset{H}{\overset{|}{N}}-A_1-O\right]_{k_1}-$$

Chemical Formula 7-2

$$-\left[\underset{H}{\overset{|}{N}}-A_1-\underset{H}{\overset{|}{N}}\right]_{k_1}-$$

Chemical Formula 7-3

$$-\left[\underset{H}{\overset{|}{N}}-A_1-\underset{}{\overset{O}{\overset{\|}{C}}}\right]_{k_1}-$$

In the above Chemical Formulas 7-1 to 7-3, $A_1$ and $k_1$ are the same as in defined above. The repeating unit of the above Chemical Formula 2 may be included in an amount of more than about 5 mol % to less than about 70 mol %, more than about 10 mol % to less than about 70 mol %, and more than about 10 mol % to less than about 50 mol %, based on the total moles of the main chain of the thermosetting aromatic oligomer. When the repeating unit of the above Chemical Formula 2 is included within the above range, solubility in a solvent may be improved.

In one embodiment, $L_1$ and $L_2$ in the above Chemical Formula 1 independently include a single bond, a substituted or unsubstituted C1 to C20 alkylene, a substituted or unsubstituted C1 to C20 alkoxylene, a substituted or unsubstituted C6 to C30 arylene, a substituted or unsubstituted C6 to C30 oxyarylene, O, COO, or CONR', where R' is hydrogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy.

In one embodiment, $Z_1$ and $Z_2$ in the above Chemical Formula 1 are independently hydroxy, maleimide, nadimide, phthalimide, alkenyl, alkynyl, propargyl ether, benzocyclobutene, cyanate, a substituted or unsubstituted C3 to C30 alicyclic group including a double bond or a triple bond, a C6 to C30 aryl including a C2 to C30 alkenyl or a C2 to C30 alkynyl, or a C6 to C30 aryl including cyanide group. Thermosetting aromatic oligomers having different kinds of thermosetting functional group may be mixed each other.

Examples of the alkynyl include acetylene.

Examples of the alicyclic group include a C3 to C30 cycloalkyl, a C3 to C30 cycloalkynyl, a C3 to C30 cycloalkenyl, a C3 to C30 heterocycloalkyl, a C3 to C30 heterocycloalkynyl, a C3 to C30 heterocycloalkenyl, and the like.

In another embodiment, $Z_1$ and $Z_2$ in the above Chemical Formula 1 are independently selected from thermosetting functional groups represented by the following Chemical Formulas 8-1 to 8-11.

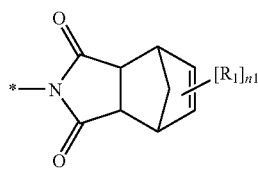

Chemical Formula 8-1

In the above Chemical Formula 8-1,
$n_1$ is an integer ranging from 0 to 6, and
$R_1$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_1$ is 2 or more, the substituent is the same or different from each other.

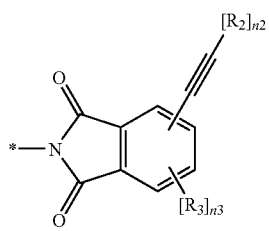

Chemical Formula 8-2

In the above Chemical Formula 8-2,
$n_2$ is 1, $n_3$ is an integer ranging from 0 to 3, and
$R_2$ and $R_3$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, when $n_3$ is 2 or more, the substituents are the same or different from each other.

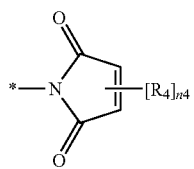

Chemical Formula 8-3

In the above Chemical Formula 8-3,
$n_4$ is an integer ranging from 0 to 2, and
$R_4$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_4$ is 2 or more, the substituent is the same or different from each other.

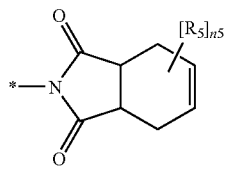

Chemical Formula 8-4

In the above Chemical Formula 8-4,
$n_5$ is an integer ranging from 0 to 8, and
$R_4$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_4$ is 2 or more, the substituent is the same or different from each other.

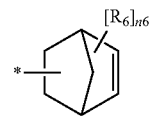

Chemical Formula 8-5

In the above Chemical Formula 8-5,
$n_6$ is an integer ranging from 0 to 7, and
$R_6$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_6$ is 2 or more, the substituent is the same or different from each other.

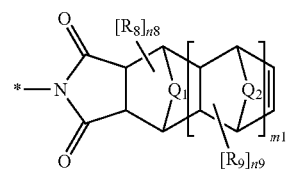

Chemical Formula 8-6

In the above Chemical Formula 8-6,
$n_8$ and $n_9$ are independently integers ranging from 0 to 6,
$R_8$ and $R_9$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when each $n_8$ and $n_9$ is 2 or more, the substituents are the same or different from each other,
$Q_1$ and $Q_2$ are independently methylene, O, or S, and
$m_1$ is an integer ranging from 1 to 3.

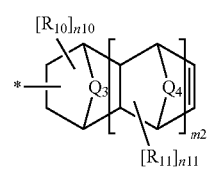

Chemical Formula 8-7

In the above Chemical Formula 8-7,
$n_{10}$ is an integer ranging from 0 to 7, $n_{11}$ is an integer ranging from 0 to 6,
$R_{10}$ and $R_{11}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{10}$ and $n_{11}$ are independently 2 or more, the substituents are the same or different from each other,
$Q_3$ and $Q_4$ are independently methylene, O, or S, and
$m_2$ is an integer ranging from 1 to 3.

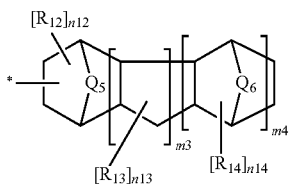

Chemical Formula 8-8

In the above Chemical Formula 8-8, $n_{12}$ is an integer ranging from 0 to 7, $n_{13}$ is an integer ranging from 0 to 6, $n_{14}$ is an integer ranging from 0 to 8, $R_{12}$ to $R_{14}$ are independently substituents selected from y hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and $n_{12}$ to $n_{14}$ are 2 or more, the substituents are the same or different from each other, $Q_5$ and $Q_6$ are independently methylene, O, or S, and $m_3$ and $m_4$ are independently integers ranging from 1 to 3.

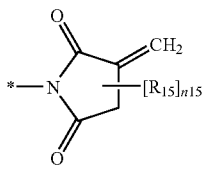

Chemical Formula 8-9

In the above Chemical Formula 8-9, $n_{15}$ is an integer ranging from 0 to 2, and $R_{15}$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ is 2, the substituent is the same or different from each other.

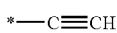  Chemical Formula 8-10

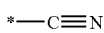  Chemical Formula 8-11

The thermosetting functional group forms a stable liquid crystal aligning structure having a rigid network shape by carrying out cross-linking reaction between thermosetting functional groups though the high temperature cure. Thereby, a printed circuit board fabricated using the thermosetting aromatic oligomer including the thermosetting functional group may improve mechanical properties of the printed circuit board.

In one embodiment, the thermosetting aromatic oligomer has an number average molecular weight of about 500 to about 15,000, and in one embodiment, about 1000 to about 4000. When thermosetting aromatic oligomer has the number average molecular weight within the range, it is possible to increase the solid amount.

In one embodiment, the thermosetting aromatic oligomer may be is included in an amount of about 10 to about 75 wt %, or about 30 to about 65 wt %, based on the total weight of the thermosetting resin composition. When the thermosetting aromatic oligomer is included within the range, the impregnating amount of thermosetting aromatic oligomer is increased in the reinforcing material such as glass fiber, so the additional impregnating process is not required.

The method of preparing a thermosetting aromatic oligomer is not specifically limited, but it may include melt polymerization, solution polymerization, bulk polymerization or the like.

In one embodiment, the thermosetting aromatic oligomer may be prepared by fusion polymerization. For example, the thermosetting aromatic oligomer may be prepared by fusion polymerization, the method comprising reacting a diamine compound with a monocarboxylic acid compound to provide a monomer (e.g., compound represented by the following Chemical Formula 9) providing a repeat unit represented by Chemical Formula 2; and heating the mixture including the monomer to provide a thermosetting aromatic oligomer though polycondensation.

  Chemical Formula 9

In the above Chemical Formula 9, $A_1$ is the same as defined in the above Chemical Formula 2, and X and Y are reactive groups deriving $X_1$ and $Y_1$ in the above Chemical Formula 2, respectively.

In one embodiment, the thermosetting aromatic oligomer may be prepared by solution polymerization. For example, the thermosetting aromatic oligomer may be prepared by solution polymerization, the method comprising introducing isophthaloyl chloride, aminophenol, 2,6-dihydroxynaphthalene, and triethylamine into a reactor and agitating the same at a room temperature to carrying out the reaction. After passing a lapse of predetermined time, a compound being capable of adding a thermosetting functional group such as maleimide, nadimide, acetylene or the like is further added and reacted to provide a thermosetting aromatic oligomer and separated and purified to synthesize a thermosetting aromatic oligomer.

In one embodiment, the thermosetting aromatic oligomer may be prepared by bulk polymerization. For example, the thermosetting aromatic oligomer may be prepared by bulk polymerization, the method comprising introducing isophthalic acid, aminophenol, 2-hydroxy-6-naphtoic acid, and acetic acid anhydride into a reactor; slowly heating until 150° C. with agitating the same; and reacting for a predetermined time with refluxing the same. Then additional acetic acid and anhydrous acetic acid are removed, and 4-hydroxy benzoic acid is further added and heated until 320° C. to perform the reaction. Thereby the aromatic oligomer having alcohol group in at least one terminal of the main chain is synthesized. Then the aromatic oligomer having alcohol group is dissolved in a solvent (e.g., DMF) and added with a compound capable of adding a thermosetting functional group and reacted to provide a thermosetting aromatic oligomer in which a thermalsetting functional group is added to at least one terminal of main chain.

Hollow Particle

In one embodiment, the hollow particle includes a porous inorganic material, a porous organic material, a porous organic-inorganic composite material, or a combination thereof.

The porous inorganic material and the porous organic material indicate an inorganic and an organic compound, respectively, capable of including air since they have pores in the inside thereof. The porous inorganic material may be made using alumina, silica, fused silica, glass, or a combination thereof, and the porous organic material may be a porous polymer and may be made using a urea resin, a phenol resin, or a combination thereof. The hollow particle may include, for example, glass porous inorganic material.

The porous inorganic material and porous organic material are commercially available. For example, the porous inorganic material and porous organic material include commercially available alumina bubble (manufactured by Pacific random), scotch bubble (manufactured by Simitomo 3M), cell star (manufactured by TOKAI KOGYO CO., LTD), hollow glass beads or the like. The hollow particle has a size of about 0.1 to about 100 μm, or a size of about 0.1 to about 50 μm. When the hollow particle has the size within these ranges, it is possible to be uniformly dispersed and to provide a thin film.

In one embodiment, the hollow particle may include an aerogel. The aerogel is a solid-phase material having a low density and fine pores in which almost volume is filled with air and has a low dielectric constant and a low thermal expansion coefficient. For example, the aerogel has a dielectric constant of about 1.1 to about 2.5. When the porosity is high, the dielectric constant may be near to 1, which is the lowest value among the present solid-phase materials. In addition, the aerogel has a thermal expansion coefficient of about 2 to about 4 ppm/° C.

The aerogel may be obtained from silica, an organic polymer, alumina, platinum, nickel, titania, zirconia, ruthenium, cobalt, or a combination thereof.

The aerogel may be hydrophilic by itself. In this case, the aerogel may be chemically treated to be hydrophobic. When it is hydrophobic, it is possible to prevent the structural change such as construction or decomposition which may be caused by adsorbing water. In addition, it may prevent the aerogel from decomposition even when deep crack is generated by performing hydrophobic treatment until the inside thereof.

The aerogel may have a pore size of about 1 to about 100 nm, or a size of about 10 to about 80 nm. When the aerogel has the pore size within the range, it may have a low dielectric constant.

The aerogel may have a porosity of about 30 to about 99.9 volume %, or for example, of about 50 to about 99.9 volume %. When the aerogel has the porosity within the range, the aerogel may have an excellent mechanical strength and a low dielectric constant.

The hollow particle may be included in an amount of about 0.5 to about 70 volume %, or in an amount of about 30 to about 60 volume %, based on the total volume of thermosetting aromatic oligomer and hollow particle. When the hollow particle is included within the range, the effect of hollow particle is optimized and the mechanical strength is improved.

In addition, the mixture of thermosetting aromatic oligomer and hollow particle may be included in an amount of about 70 wt % or less, or in an amount of about 30 wt % or less based on the total amount of thermosetting resin composition. When the mixture of thermosetting aromatic oligomer and hollow particle is included within the range, it is possible to maintain the suitable viscosity required for impregnating into the reinforcing material such as glass fiber during fabricating prepreg.

Solvent

In one embodiment, the solvent is an aprotic solvent that include a halogen-based solvent such as 1-chlorobutane, chlorobenzene, 1,1-dichloroethane, 1,2-dichloroethane, chloroform, 1,1,2,2-tetrachloroethane, and the like; an ether-based solvent such as diethylether, tetrahydrofuran, 1,4-dioxane, and the like; a ketone-based solvent such as methylethylketone (MEK), acetone, cyclohexanone, and the like; an acetate-based solvent such as propylene glycol monomethyl ether acetate (PGMEA); an ester-based solvent such as ethyl acetate, and the like; a lactone-based solvent such as γ-butyrolactone, and the like; a carbonate-based solvent such as ethylenecarbonate, propylenecarbonate, and the like; an amine-based solvent such as triethylamine, pyridine, and the like; a nitrile-based solvent such as acetonitrile, and the like; an amide-based solvent such as N,N'-dimethyl formamide (DMF), N,N'-dimethyl acetamide (DMAc), tetramethylurea, N-methylpyrrolidone (NMP), and the like; a nitro-based solvent such as nitromethane, nitrobenzene, and the like; a sulfide-based solvent such as dimethyl sulfoxide (DMSO), sulfolane, and the like; a phosphoric acid-based solvent such as hexamethylphosphoric acid amide, tri-n-butylphosphoric acid, and the like; or a combination thereof, but is not limited thereto.

In one embodiment, the solvent is selected from the group consisting of N-methylpyrrolidone (NMP), dimethyl sulfoxide (DMSO), N,N'-dimethyl formamide (DMF), N,N'-dimethyl acetamide (DMAc), methylethylketone (MEK), propylene glycol monomethyl ether acetate (PGMEA), or a combination thereof may be used.

In one embodiment, the solvent may be included in an amount of about 30 to about 95 wt %, based on the total amount of thermosetting resin composition according to one embodiment. When the solvent is included within the ranges, it is possible to maintain the suitable viscosity.

In one embodiment, the thermosetting resin composition may further include a polymer such as thermosetting resin and thermoplastic resin besides the thermosetting aromatic oligomer.

Examples of the polymer include, for example, a phosphorous compound such as phosphoric acid ester and phosphoric acid melamine, a nitrogen-containing compound such as melamine and benzoguanamine, an oxazine cyclic-containing compound, a silicon compound, polyimide, polyvinylacetal, a phenoxy resin, an acryl resin, an acryl resin including a hydroxy or carboxyl group, an alkyd resin, elastomers such as a polyurethane resin, polybutadiene, a butadiene-acrylonitrile copolymer, polychloroprene, a butadiene-styrene copolymer, polyisoprene, a butyl rubber, a fluoro rubber, a natural rubber, a styrene-isoprene rubber, an acryl rubber, an epoxylated butadiene, a malated butadiene, polyethylene, polypropylene, polyethylene-propylene copolymer, polyvinyl chloride, polyvinylidene chloride, polystyrene, polyvinyl toluene, polyvinyl phenol, an acrylonitrile-styrene resin, an acrylonitrile-butadiene-styrene resin, an acrylate-butadiene-styrene resin, poly-4-fluoroethylene, fluoroethylene-propylene, 4-fluoroethylene-6-fluoroethylene, vinylidene fluoride, polycarbonate, polyester carbonate, polyphenylene ether, polysulfone, polyester, polyether sulfone, polyamide, polyamide imide, polyester imide, polyphenylene sulfite, (meth) acrylate, epoxy(meth)acrylate, di(meth)acryloxy-bisphenol, poly(meth)acrylate, styrene, vinylpyrrolidone, diacryl phthalate, divinylbenzene, diallylbenzene, diallyl ether bisphenol, trialkenyl isocyanurate, dicyclopentadiene, a phenol resin, polyisocyanate, and the like.

The polymer may be included in an amount about 1 to about 50 parts by weight based on 100 parts by weight of thermosetting resin composition including thermosetting aromatic oligomer, hollow particle, and solvent. When the polymer is included within the range, the intrinsic characteristic of thermosetting resin composition according to one embodiment is not damaged.

In one embodiment, the thermosetting resin composition may further include a maleimide-based compound as well as the polymer. The maleimide-based compound acts as a crosslinking agent in the thermosetting resin composition. In one embodiment the maleimide-based compound includes two or more maleimide groups. Examples of the maleimide-based compound include a bismaleimide compound represented by the following Chemical Formula 10 and a trimaleimide compound represented by the following Chemical Formulas 13 and 14.

Chemical Formula 10

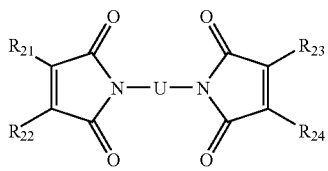

In the above Chemical Formula 10,

U is a C1 to C20 alkylene, a C6 to C30 arylene, or a linking group represented by the following Chemical Formula 11-1, and $R_{21}$ to $R_{24}$ are independently hydrogen or a C1 to C20 alkyl.

Chemical Formula 11-1

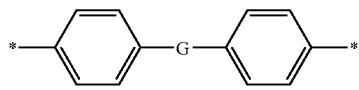

In the above Chemical Formula 11-1,

G is O, S, CO, SO, $SO_2$, a substituted or unsubstituted C2 to C20 alkylene, a substituted or unsubstituted C2 to C20 alkoxylene, a substituted or unsubstituted C2 to C20 oxyalkoxylene, a substituted or unsubstituted C6 to C30 arylene, a substituted or unsubstituted C6 to C30 oxyarylene, a substituted or unsubstituted C6 to C30 heteroarylene, a substituted or unsubstituted C6 to C30 oxyheteroarylene, or a linking group represented by the following Chemical Formula 11-2.

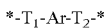 Chemical Formula 11-2

In the above Chemical Formula 11-2,

Ar is one selected from arylene represented by the following Chemical Formulas 11-3 to 11-9, and $T_1$ and $T_2$ are independently O, S, CO, SO, $SO_2$, CONH, or COO.

Chemical Formula 11-3

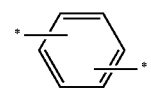

Chemical Formula 11-4

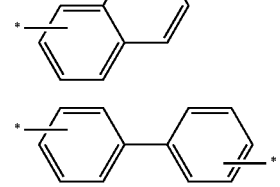

Chemical Formula 11-5

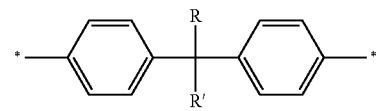

Chemical Formula 11-6

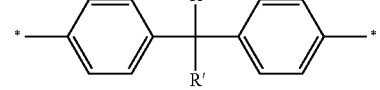

Chemical Formula 11-7

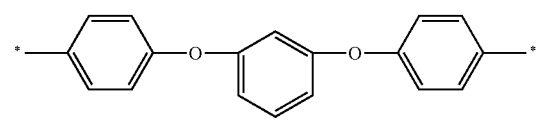

Chemical Formula 11-8

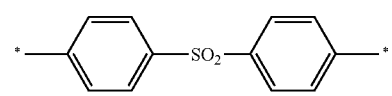

Chemical Formula 11-9

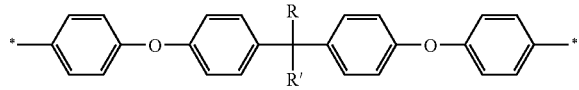

In the above Chemical Formulas 11-6 and 11-9,

R and R' are independently a C1 to C20 alkyl.

U in the above Chemical Formula 10 includes one of the linking groups represented by the following Chemical Formulas 11-10 to 11-18.

Chemical Formula 11-10

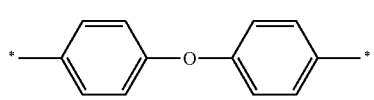

Chemical Formula 11-11

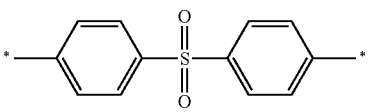

Chemical Formula 11-12

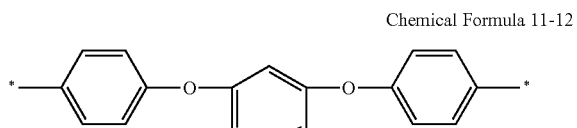

Chemical Formula 11-13

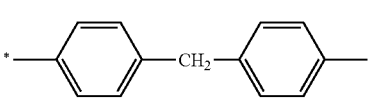

Chemical Formula 11-14

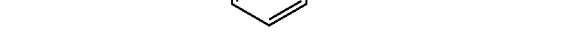

Chemical Formula 11-15

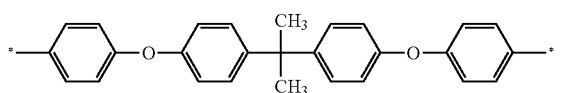

-continued

Chemical Formula 11-16

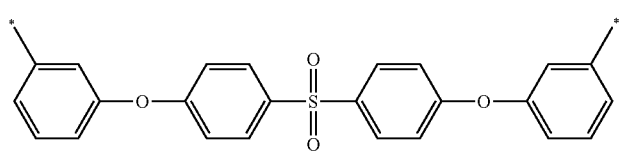

Chemical Formula 11-17

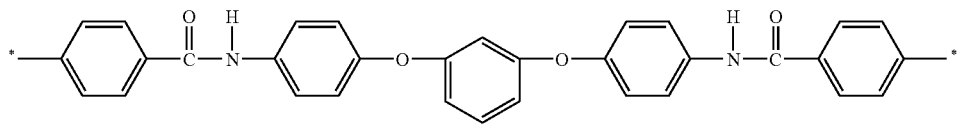

Chemical Formula 11-18

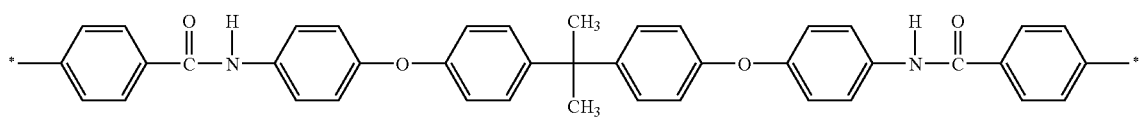

Examples of the bismaleimide compound include one selected from the compounds represented by the following Chemical Formulas 12-1 to 12-18, but are not limited thereto.

Chemical Formula 12-1

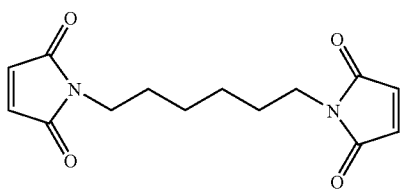

Chemical Formula 12-2

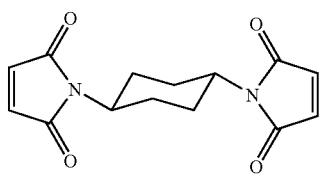

Chemical Formula 12-3

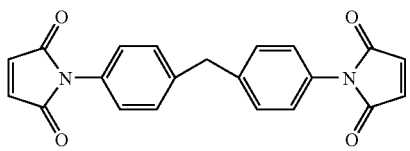

Chemical Formula 12-4

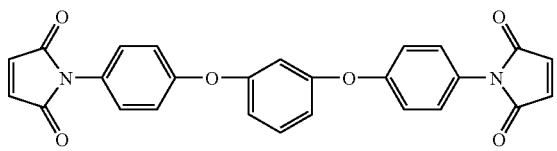

Chemical Formula 12-5

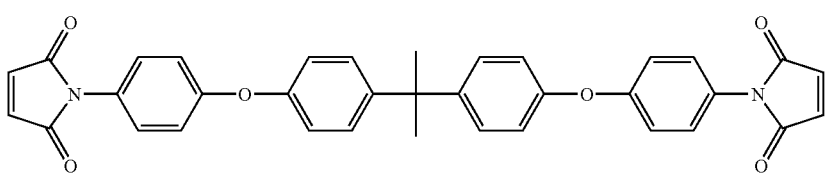

Chemical Formula 12-6

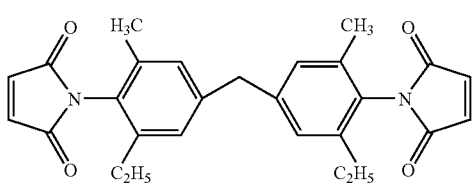

Chemical Formula 12-7

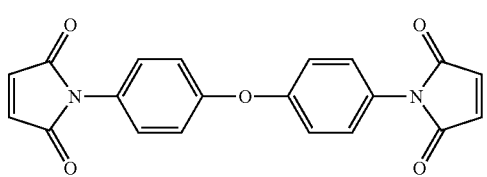

Chemical Formula 12-8

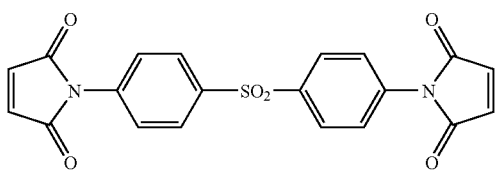

-continued
Chemical Formula 12-9
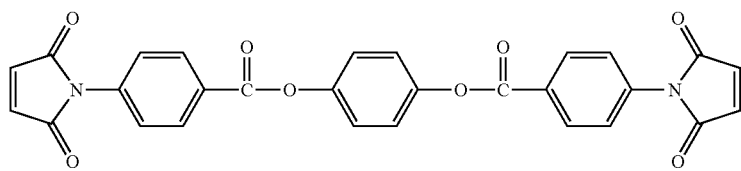
Chemical Formula 12-10
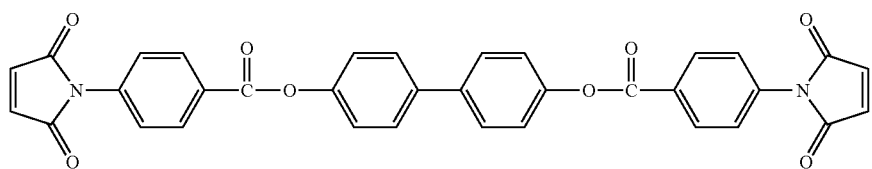
Chemical Formula 12-11
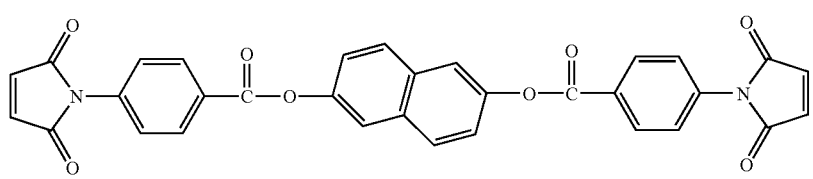
Chemical Formula 12-12
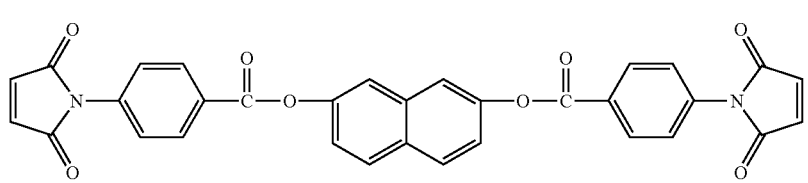
Chemical Formula 12-13
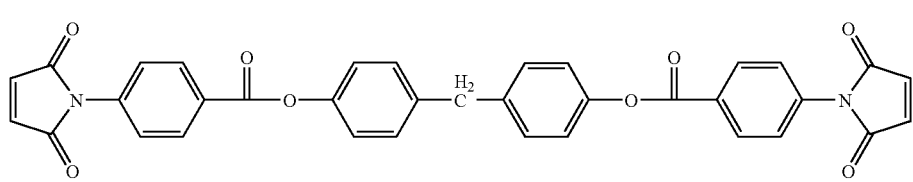
Chemical Formula 12-14
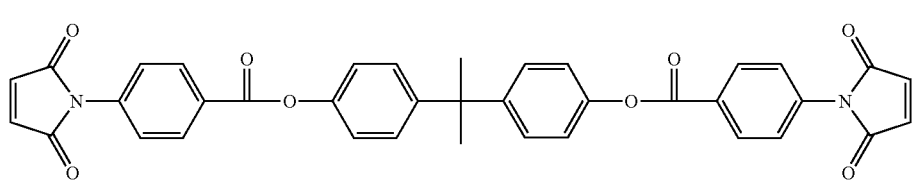
Chemical Formula 12-15
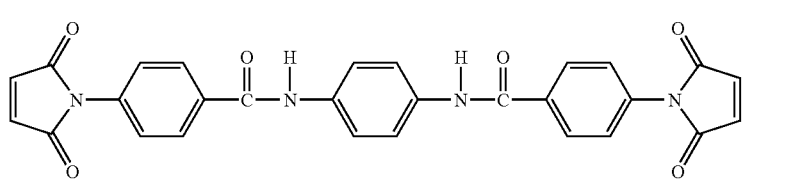
Chemical Formula 12-16
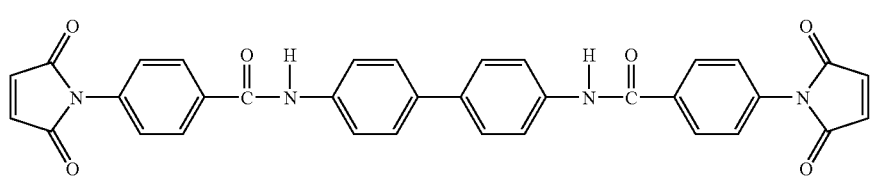
Chemical Formula 12-17
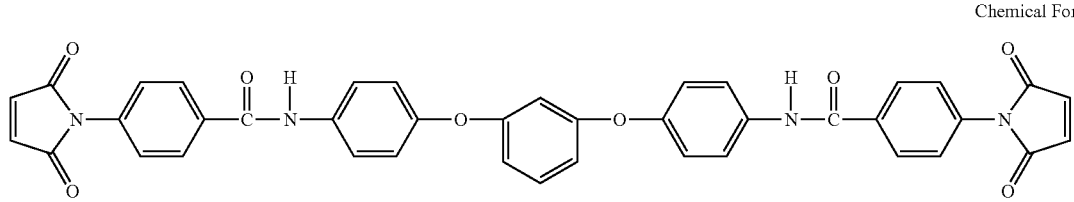

Chemical Formula 12-18

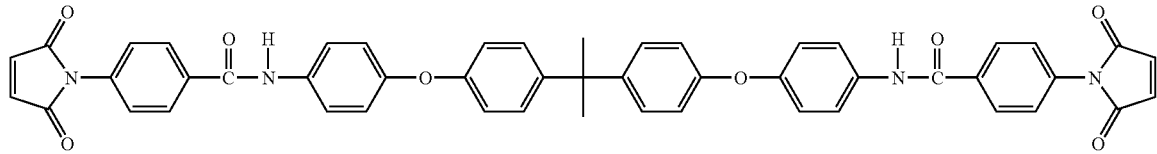

Chemical Formula 13

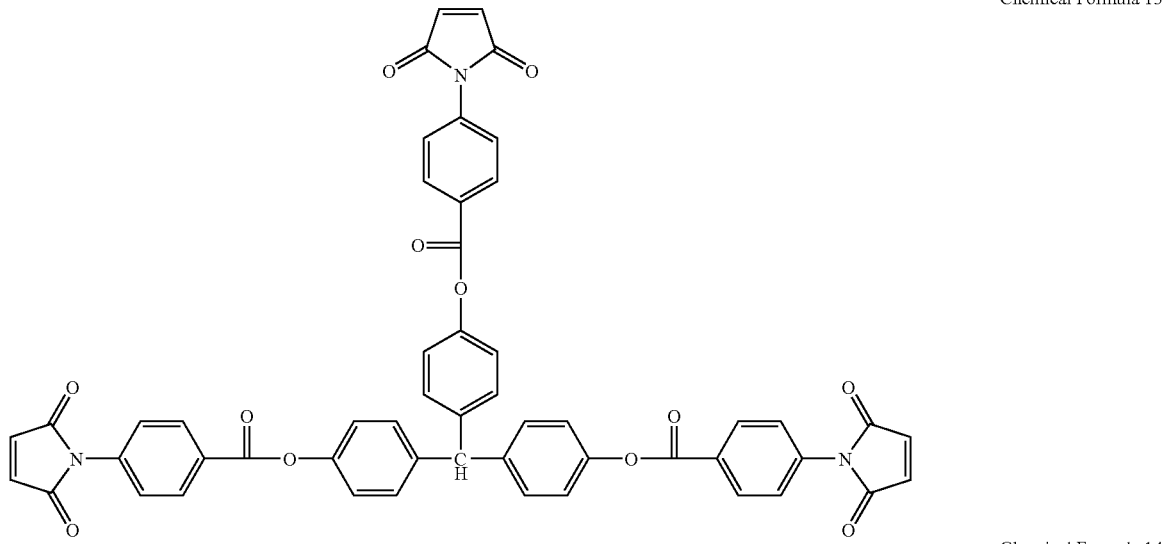

Chemical Formula 14

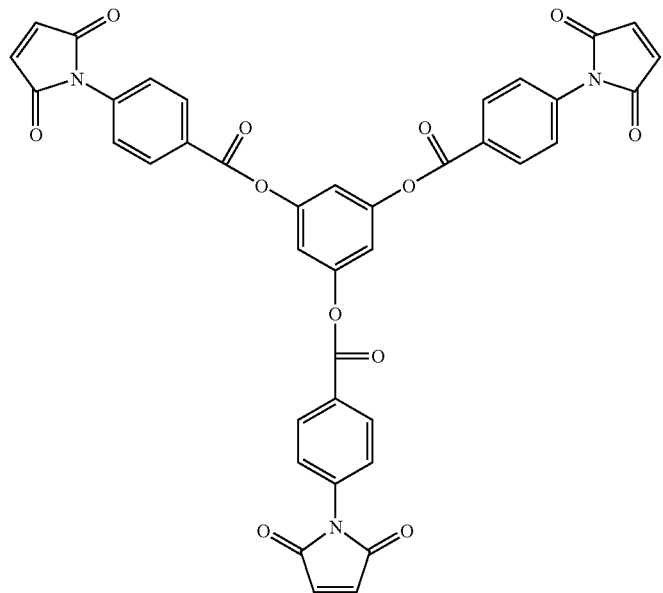

In one embodiment, the maleimide-based compound may be prepared by reacting aromatic diamine with maleic anhydride to provide aromatic bismaleamide acid; and substituting the aromatic bismaleamide acid to aromatic bismaleimide compound through a ring-closing reaction.

In one embodiment, the thermosetting resin composition may further include an epoxy-based compound. Therefore, the thermosetting resin composition may have an increased adherence to a material such as copper.

The epoxy-based compound includes phenols such as cresol novolac-type epoxy resin, phenol novolac-type epoxy resin, naphthol modified novolac-type epoxy resin, bisphenol A-type epoxy resin, bisphenol F-type epoxy resin, biphenyl-type epoxy resin, triphenyl-type epoxy resin; glycidylether-type epoxy resin; alcohols such as polypropylene glycol glycidyl ether, hydrogen-added bisphenol A-type epoxy resin or the like; glycidyl ether-type epoxy resin; dicyclopentadiene-type epoxy resin having a dicyclopentadiene backbone; naphthalene-type epoxy resin having a naphthalene backbone; di hydroxybenzopyran-type epoxy resin; dihydroxydinaphthalene-type epoxy resin; glycidylester-type epoxy resin made of hexahydro anhydrous phthalic acid or dimer acid or the like; glycidylamine-type epoxy resin made of polyamine such as diamino phenyl methane or the like; alicyclic-type epoxy resin; bromide epoxy resin; or a combination thereof.

Another example of the epoxy-based compound may include a structural unit represented by the following Chemical Formula 15, and the epoxy equivalent weight may range from about 100 to about 400 g/eq. Further another example thereof may include two structural units represented by the following Chemical Formula 15, and the epoxy equivalent weight may range from about 100 to about 150 g/eq. Yet further another example thereof may include at least two structural units represented by the following Chemical Formula 15, and the epoxy equivalent weight range from about 150 to about 200 g/eq, from about 200 to about 250 g/eq, or from about 250 to about 300 g/eq.

Chemical Formula 15

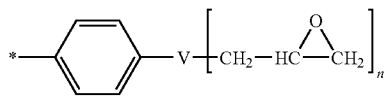

In the above Chemical Formula 15,
V is O, S, P, or N, and when V is 0 or S, n is 1, and when V is P or N, n is 1 or 2.

Each maleimide-based compound and epoxy-based compound may be included in an amount of about 5 to about 100 parts by weight based on 100 parts by weight of solvent. When the maleimide-based compound and the epoxy-based compound are respectively included within the range, the thermal expansion coefficient is decreased to improve the heat resistance. Thereby, the obtained printed circuit board improves the mechanical characteristic, the physiochemical characteristics or the like.

The mixing weight ratio of the thermosetting aromatic oligomer and the maleimide-based compound or the epoxy-based compound is not specifically limited, but it may be mixed, for example, in a weight ratio of 1:9 to 9:1.

The thermosetting resin composition according to one embodiment includes a thermosetting aromatic oligomer in amount of about 20 to about 80 parts by weight based on the total solid amount; a maleimide-based compound in amount of about 5 to about 30 parts by weight based on the total solid amount; and an epoxy-based compound in amount of about 5 to about 30 parts by weight based on the total solid amount.

The thermosetting resin composition may further include additives such as fillers, softening agents, plasticizers, antioxidants, flame retardants, flame-retardant aids, lubricants, antistatic agents, colorants, heat stabilizers, light stabilizers, UV absorbers, coupling agents, or precipitation inhibitors.

The fillers include organic fillers and inorganic fillers. Examples of the organic fillers include epoxy resin powder, melamine resin powder, urea resin powder, benzoguanamine resin powder, a styrene resin, and the like. Examples of the inorganic fillers include natural silica, fused silica, amorphous silica, hollow silica, aluminum hydroxide, boehmite, magnesium hydroxide, molybdenum oxide, zinc molybdate, zinc borate, zinc stannate, aluminum borate, potassium titanate, magnesium sulfate, silicon carbide, zinc oxide, silicon nitride, silicon dioxide, aluminum titanate, barium titanate, barium strontium titanate, aluminum oxide, alumina, clay, kaolin, talc, calcined clay, calcined kaolin, calcined talc, mica, short glass fiber, and the like. They may be used singularly or as a mixture of two or more thereof.

Examples of the plasticizers include polyethylene glycol, a polyamide oligomer, ethylene bisstearoamide, ester phthalate, a polystyrene oligomer, liquid paraffin, polyethylene wax, silicone oil, and the like. They may be used singularly or as a mixture of two or more thereof.

Examples of the antioxidant include a phosphorous-containing antioxidant, a phenolic antioxidant, a sulfur-containing antioxidant, and the like. They are used singularly or as a mixture of two or more thereof.

Examples of the flame retardant include bromide polystyrene, bromide syndiotactic polystyrene, bromide polyphenylene ether, bromine-containing diphenylalkane, bromine-containing diphenyl ether, and the like. They may be used singularly or as a mixture of two or more thereof.

In addition, flame-retardant aids may include antimony trioxide.

In one embodiment, the thermosetting resin composition may be prepared by blending the components of the thermosetting aromatic oligomer, hollow particle, solvent, and the like in accordance with various methods, such as mixing at room temperature or melt-mixing the same.

According to another embodiment, a resin cured product comprising the thermosetting resin composition is provided. The resin cured product is a product obtained by curing the thermosetting resin composition.

According to another embodiment, a prepreg including the resin cured product and a reinforcing material is provided. The prepreg may be fabricated by coating or impregnating the resin cured product to the reinforcing material, and drying the same to remove the solvent. For example, the prepreg may be fabricated by dispersing hollow particle in a solvent, adding with and dissolving thermosetting aromatic oligomer to provide a solution, impregnating the solution into a reinforcing material, and drying the same to provide a prepreg; or by dissolving thermosetting aromatic oligomer in a solvent; adding with and dispersing hollow particle; and drying the same to provide a prepreg.

Examples of the reinforcing material include glass fibers, woven glass fibers, woven alumina glass fibers, non-woven glass fiber fabrics, silica glass fibers, woven carbon fibers, carbon fiber, non-woven cellulose fabrics, polymer fabrics, alumina fibers, silicon carbide fibers, asbestos, rock wools, mineral wools, plaster whisker, woven fabrics thereof or non-woven fabrics thereof, aromatic polyamide fibers, polyimide fibers, liquid crystal polyesters, polyester fibers, fluorine fibers, polybenzoxazole fibers, glass fibers including polyamide fibers, glass fibers including carbon fibers, glass fibers including polyimide fibers, glass fibers including aromatic polyesters, glass paper, mica paper, alumina paper, craft paper, cotton paper, paper-glass bond paper, and the like. They may be used singularly or as a mixture of two or more thereof.

The dispersion may be performed by a homogenizer, an ultrasonic wave, or an agitator.

In order to evaporate the solvent, it may be heated under a reduced pressure or may be ventilated.

The resin cured product may be impregnated in an amount of about 40 to about 70 wt % based on the total amount of prepreg. When it is impregnated within the range, the adhesion between prepregs is improved, and the mechanical strength and the size stability of prepreg are improved. The impregnated amount of resin cured product indicates the total amount of resin cured product disposed on the surface of reinforcing material and the resin cured product impregnated into and attached to the reinforcing material. The resin cured product disposed on the surface of reinforcing material refers to including the laminate on the surface of reinforcing material.

According to another embodiment, a board including the prepreg is provided. The term "board" includes various boards, including circuit boards, and/or printed circuit boards, but is not limited thereto.

The board is not specifically limited, but it may include, for example, each layer of multi-layered board, a laminate bound with a metal foil, and a printed board or the like. In addition, it may include the prepreg bound with metal foil or the like.

The board may have several shapes, for example, film shape. The film may be provided by curing the thermosetting resin composition to provide a thin film. For example, the method may include a casting method including casting a thermosetting composition into a film; a dipping method including dipping an inorganic board such as glass or fabric material into varnish of thermosetting resin composition and forming a board into a film; and the like, but is not limited thereto. In the board, the thermosetting resin composition is cured.

The board may be bound with metal foil. The metal foil may include copper foil, aluminum foil or the like. The thickness of metal foil is different depending upon the usage, but it may range, for example, from about 5 to about 100 μm. The metal foil may be bound with the surface of resin cured product. The metal foil of laminate surface may be patterned. For example, the metal foil is treated with circuit process (e.g., etching process) to provide a printed circuit board. On the surface of printed laminate, the metal foil coated laminates is similarly laminated and processed to provide a multilayer printed circuit board.

The binding with metal foil may be performed by coating the thermosetting composition on the metal foil (e.g., copper foil) or casting the same on the metal foil (e.g., copper foil), removing the solvent, and heating the same. The solvent is removed by, for example, evaporation. In order to evaporate the solvent, it may be heated under a reduced pressure or may be ventilated.

The coating of the thermosetting resin composition may be performed by roller coating, dip coating, spray coating, spin coating, curtain coating, slit coating, screen printing, and the like, but is not limited thereto. According to one embodiment, the thermosetting resin composition may be filtered using a filter before coating or casting on the copper foil in order to remove fine impurities included in solution.

In one embodiment, the board is a printed circuit board. The printed circuit board may be fabricating by laminating interlayer board, prepreg, and metal foil in accordance with the design specification; inputting into a press and press and heating the same to fuse/cure the prepreg and attach the copper foil and the inner board. In addition, the printed circuit board may be patterned with conductive material on one side or both sides of prepreg, or it may be a plurality of prepregs laminated.

The binding with the metal may be used as one component of printed circuit board and include, for example, a resin coated copper (RCC), copper clad laminate (CCL) or the like.

The printed circuit board may be applied to a storage medium such as a hard disk drive (HDD), a solid state drive (SSD), a memory stick or the like or the various devices using a printed circuit board. For example, the printed circuit board may be electrically connected to a memory chip by mounting memory chip through a lead or without a lead.

As storage medium required to be slimmer and having higher driving speed are needed, the printed circuit board is required to have higher density, which is accomplished by providing multi-layer printed circuit boards and by decreasing board thickness, a diameter of through-hole, a distance between hole gaps or the like. For example, SSD may provide increased driving speed as compared with the common HDD by using a flash memory chip. For this purpose, the printed circuit board is required to be thinner and have a higher density than those in the common HDD. However, when the thickness of board is decreased, it is difficult to ensure the low dielectric characteristic and low thermal expansion coefficient into the appropriate level. However, the printed circuit board according to the various embodiments disclosed herein has low thermal expansion coefficient and low dielectric characteristic, so it may be also usefully applied to the next generational storage medium such SSD.

The SSD (solid state device) may include a CMOS device, a MOS device, a CIS (conductor-insulator-semiconductor) device, an electro-optical device, a mono-atomic device, a mono-molecular device, a mono-hole device, a mono-atomic PN junction device, a mono-molecular PN junction device, a mono-electronic device, a one-dimensional solid device, a two-dimensional solid device, or a three-dimensional solid device.

Hereinafter, this disclosure is illustrated in more detail with reference to examples. However, they are exemplary embodiments and are not limiting.

Example 1

For this example, 32.83 g (0.2 mol) of 5-norbornene-2,3-dicarboxylic anhydride (nadic anhydride) is added into 400 ml of acetic acid (glacial) in 1000 ml flask and dissolved by heating at 110° C., and then excessive amount of 41.1 g (0.3 mol) of 4-aminobenzoic acid is added. The mixture is agitated for 2 hours after the adding and reacted, and then it is precipitated at a room temperature. The precipitate is washed with each acetic acid and water and dried in a vacuum oven at 60° C. to provide 4-nadimidobenzoic acid in yield of 95%.

10.798 g (0.065 mol) of isophthalic acid, 23.974 g (0.127 mol) of 6-hydroxy-2-naphtoic acid, 17.60 g (0.127 mol) of 4-hydroxy-benzoic acid, 14.187 g (0.130 mol) of 4-aminophenol, and 58.396 g (9.5 mol) of acetic acid anhydride are introduced into a 500 ml flask mounted with a condenser and an agitator (mechanical stirrer) and slowly heated until 140° C. under the nitrogen atmosphere. The mixture is reacted while maintaining the temperature to complete an acetylation reaction. Then 36.79 g (0.130 mol) of the obtained 4-nadimide benzoic acid is added and heated until 215° C. in a heating speed of 1 to 2° C./min, while removing the side-product of acetic acid and non-reacted acetic acid anhydride. Then it is reacted at the temperature for 4 hours to provide a thermosetting aromatic oligomer (number average molecular weight Mn=3300) having a thermosetting functional group in the terminal. FIG. 1 shows $^1$H-NMR data of thermosetting aromatic oligomer product. In the graph shown in FIG. 1, F1 in the horizontal axis refers to a frequency region with respect to the time axis.

10 g of thermosetting aromatic oligomer powder is added in 90 g of N-methyl-2-pyrrolidone and heated until 60° C. and completely dissolved to provide a brown solution. 0.015 g of silica aerogel having a porosity of 90 volume % is added in 10 g of the solution and agitated at a room temperature to provide a thermosetting resin composition mixed with aerogel.

Example 2

A thermosetting resin composition is prepared in accordance with the same procedure as in Example 1, except that 0.053 g of silica aerogel is added.

Example 3

A thermosetting resin composition is prepared in accordance with the same procedure as in Example 1, except that 0.125 g of silica aerogel is added.

Example 4

A thermosetting resin composition is prepared in accordance with the same procedure as in Example 1, except that 0.833 g of silica aerogel is added.

Comparative Example 1

A thermosetting resin composition is prepared in accordance with the same procedure as in Example 1, except that silica aerogel is not added.

Control 1

The thermosetting aromatic oligomer obtained from Example 1 is input into a molder and heated until 50° C., then it is fused and molded to provide a film having a diameter of 2 cm and a thickness of 300 μm.

Experimental Example 1

Measurement of Thermal Expansion Coefficient

Each thermosetting resin composition obtained from Examples 1 to 4 and Comparative Example 1 is coated on a silicon wafer, dried at 200° C., heated until 290° C., and then cured for one hour. Each obtained specimen was measured to determine a thermal expansion coefficient, and the results are shown in the following Table 1. The thermal expansion coefficient was measured under the nitrogen atmosphere. The temperature is increased at a ratio of 5° C./min.

Experimental Example 2

Measurement of Dielectric Constant

Each thermosetting resin composition obtained from Examples 1 to 4 and Comparative Example 1 is coated on a copper foil, dried at 200° C., heated until 290° C., and then cured for one hour. The copper foil is peeled off to measure a dielectric constant, and the results are shown in the following Table 1. The dielectric constant is measured under the 1 GHz condition.

In order to compare, the dielectric constant of film obtained from Control 1 is measured under the 1 GHz condition, and the dielectric constant is 2.8.

TABLE 1

|  | Example 1 | Example 2 | Example 3 | Example 4 | Comparative Example 1 |
|---|---|---|---|---|---|
| Thermal expansion coefficient (ppm/° C.) | 33 | 25 | 16 | 6 | 35 |
| Dielectric constant | 2.5 | 2.1 | 1.7 | 1.25 | 2.9 |

As shown in Table 1, it is confirmed that Examples 1 to 4 including thermosetting resin composition of hollow particle have lower thermal expansion coefficient and lower dielectric constant than those of Comparative Example 1, which does not include a hollow particle. Accordingly, a prepreg and a printed circuit board may improve the signal delay, the intensity deterioration or the like.

Example 5

For this example, a thermosetting aromatic oligomer having a nadimide terminal group obtained from Example 1 is prepared.

29.9 g (0.18 mol) of isophthalic acid, 16.9 g (0.09 mol) of 6-hydroxy-2-naphtoic acid, 18.6 g (0.135 mol) of 4-hydroxybenzoic acid, 24.6 g (0.225 mol) of 4-aminophenol, and 68.9 g (0.675 mol) of acetic acid anhydride are introduced into a 500 ml three-neck flask mounted with a condenser and an agitator (mechanical stirrer) and slowly heated until 140° C. under the nitrogen atmosphere. The mixture is reacted for 3 hours with maintaining the temperature to complete an acetylation reaction. Subsequently, 8.5 g (0.045 mol) of the obtained 6-hydroxy-2-naphtoic acid is further added and heated until 270° C. while removing the side-product of acetic acid and non-reacted acetic acid anhydride. Then it is reacted for 30 minutes to provide a liquid crystal amide-ester oligomer which is a thermosetting aromatic oligomer having a hydroxyl terminal group. The obtained thermosetting aromatic oligomer has a structure represented by the following Chemical Formula 16.

Chemical Formula 16

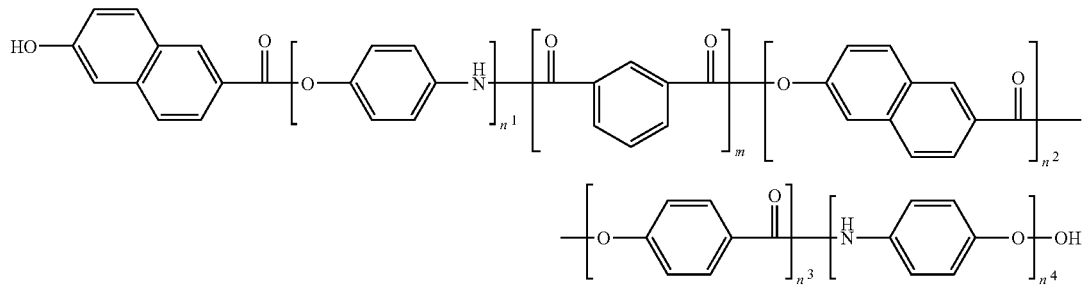

3 g of the obtained thermosetting aromatic oligomer having a nadimide terminal group, 3 g of the thermosetting aromatic oligomer having a hydroxyl terminal group, 2 g of bismaleimide compound (Daiwakasei Industry Co., LTD, BM1-100), and 2 g of epoxy-based compound (Huntsman, MY 721) are added in 90 g of N-methyl-2-pyrrolidone and heated until 60° C., then it is completely dissolved to provide a brown solution. 0.39 g of silica aerogel having a porosity of 90 volume % into 10 g of the solution and agitated at a room temperature to provide a thermosetting resin composition mixed with aerogel. The obtained thermosetting resin composition is impregnated in glass fiber (impregnating ratio: 55 wt %), and the glass fiber impregnated with the thermosetting resin composition is coated on a copper foil and cured in a high temperature electric furnace at about 300° C. for one hour. Then the copper foil is removed by nitric acid aqueous solution to provide a prepreg.

Example 6

A thermosetting resin composition and a prepreg using the same are fabricated in accordance with the same procedure as in Example 5, except that 0.75 g of silica aerogel is added.

Comparative Example 2

A thermosetting resin composition and a prepreg using the same are fabricated in accordance with the same procedure as in Example 5, except that silica aerogel is not added.

Experimental Example 3

Measurement of Thermal Expansion Coefficient

Each prepreg obtained from Examples 5 and 6 and Comparative Example 2 is measured to determine a thermal expansion coefficient between 50° C. and 150° C. using a thermo-mechanical analyzer. The results are shown in the following Table 1. Since a high temperature cured sample include remaining thermal history, first and second thermal expansion coefficients are obtained through two times temperature scanning.

TABLE 2

|  | Thermal expansion coefficient (ppm/° C.) | |
| --- | --- | --- |
|  | First scan | Second scan |
| Example 5 | 10.9 | 8.4 |
| Example 6 | 12.1 | 15.9 |
| Comparative Example2 | 15.8 | 17.4 |

As shown in Table 2, it is confirmed that the thermosetting resin compositions including hollow particles according to Examples 5 and 6 have a lower thermal expansion coefficient compared to a thermosetting resin compositions that does not contain hollow particles according to Comparative Example 2. Thereby, it is understood that a prepreg and printed circuit board may improve the signal delay, the intensity deterioration or the like.

Particularly, it is understood that Examples 5 and 6 including hollow particles of aerogel, even in the case of including a small amount of aerogel, have a good effect.

Example 7

A thermosetting resin composition and a prepreg using the same are fabricated in accordance with the same procedure as in Example 5, except that the thermosetting resin composition is impregnated in glass fiber in an impregnating ratio of 40 wt %.

Comparative Example 3

A thermosetting resin composition and a prepreg using the same are fabricated in accordance with the same procedure as in Comparative Example 2, except that the thermosetting resin composition is impregnated in glass fiber in a rate of 50 wt %.

Experimental Example 4

Measurement of Dielectric Constant

Each prepreg obtained from Example 7 and Comparative Example 3 is measured to determine a dielectric constant, and the results are shown in the following Table 3. The dielectric constant is measured under the 1 GHz condition.

TABLE 3

|  | Example 7 | Comparative Example 3 |
| --- | --- | --- |
| Dielectric constant | 2.62 | 3.5 |

As shown in Table 3, it is confirmed that the thermosetting resin composition including hollow particles according to Example 7 has a lower dielectric constant compared to a thermosetting resin compositions that does not contain hollow particles according to Comparative Example 3. Accordingly, it is understood that a prepreg and printed circuit board may improve the signal delay, intensity deterioration or the like.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thermosetting resin composition comprising:
   a thermosetting aromatic oligomer represented by the following Chemical Formula 1;
   a hollow particle, wherein the hollow particle comprises an aerogel; and
   a solvent:

Chemical Formula 1

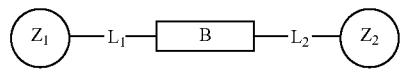

wherein in the above Chemical Formula 1,
B is a main chain including a repeating unit represented by the following Chemical Formula 2 or the following Chemical Formula 6,
$L_1$ and $L_2$ are linking groups,
$Z_1$ and $Z_2$ are a thermosetting functional group including a multiple bond at a terminal end or a hydroxyl group, the $Z_1$ and $Z_2$ being independently selected from hydroxy, maleimide, nadimide, phthalimide, alkenyl, alkynyl, propargyl ether, benzocyclobutene, cyanate, a substituted or unsubstituted C3 to C30 alicyclic group including a double bond or a triple bond, a C6 to C30 aryl including a C2 to C30 alkenyl or a C2 to C30 alkynyl, and a C6 to C30 aryl including cyanide group, Chemical Formula 2

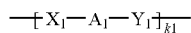

wherein in the above Chemical Formula 2, $A_1$ is an aromatic cyclic group including at least one arylene represented by the following Chemical Formulas 3-1 to 3-5, and at least one arylene represented by the following Chemical Formula 5-1 to 5-4, $X_1$ and $Y_1$ are independently COO, O, CNR', CONR", NR''', or CO, where R', R", and R''' are independently hydrogen, a substituted or unsubstituted C1 to C20 alkyl, or a substituted or unsubstituted C6 to C30 aryl, and $k_1$ is an integer ranging from 1 to 50, Chemical Formula 6

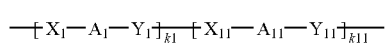

wherein in the above Chemical Formula 6, $A_1$ is selected from arylene represented by the following Chemical Formula 3-1 to 3-5, $A_{11}$ is selected from arylene represented by the following Chemical Formula 5-1 to 5-4, $X_1$ and $X_{11}$ and $Y_1$ and $Y_{11}$ are independently COO, O, CNR', CONR", NR''', or CO, where R', R", and R''' are independently hydrogen, a substituted or unsubstituted C1 to C20 alkyl, or a substituted or unsubstituted C6 to C30 aryl, and $k_1$ and $k_{11}$ integers ranging from 1 to 50, Chemical Formula 3-1

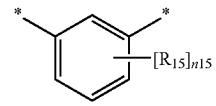

Chemical Formula 3-2

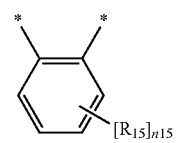

wherein in the above Chemical Formulas 3-1 and 3-2, $n_{15}$ is an integer ranging from 0 to 4, $R_{15}$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ is 2 or more, the substituent is the same or different from each other, and the aromatic cyclic group includes a heteroatom selected from N, O, S, or P, Chemical Formula 3-3

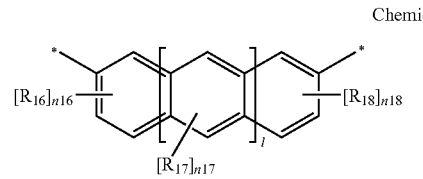

Chemical Formula 3-4

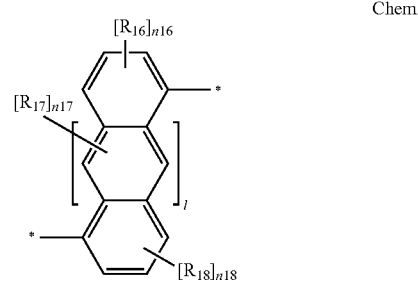

wherein in the above Chemical Formulas 3-3 and 3-4, $n_{16}$ and $n_{18}$ are independently integers ranging from 0 to 3, $n_{17}$ is an integer ranging from 0 to 2, $R_{16}$, $R_{17}$ and $R_{18}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{16}$ to $n_{18}$ are 2 or more, the substituents are the same or different from each other, l is an integer ranging from 0 to 3, and the aromatic cyclic group includes a heteroatom selected from N, O, S, or P, Chemical Formula 3-5

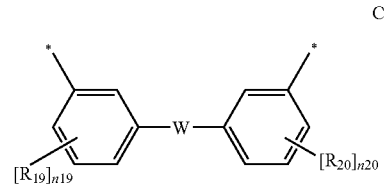

wherein in the above Chemical Formula 3-5, $n_{19}$ and $n_{20}$ are independently integers ranging from 0 to 4, $R_{19}$ and $R_{20}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{19}$ and $n_{20}$ are 2 or more, the substituents are the same or different from each other, W is a single bond, O, S, CO, $SO_2$, $N_2$, a substituted or unsubstituted C1 to C20 alkylene, a substituted or unsubstituted C1 to C20 alkoxylene, a substituted or unsubstituted C6 to C30 arylene, a substituted or unsubstituted C6 to C30 oxyarylene, a substituted or unsubstituted C6 to C30 heteroarylene, a substituted or unsubstituted C6 to C30 oxyheteroarylene, CONR', or a linking group represented by the following Chemical Formula 4-1 to 4-7, where R and R' are independently hydrogen, a substituted or unsub- stituted C1 to C20 alkyl, a substituted or unsubstituted C1 to C20 alkoxy, a substituted or unsubstituted C6 to C30 aryl, or a substituted or unsubstituted C6 to C30 aryloxy, and
the aromatic cyclic group includes a heteroatom selected from N, O, S, or P, Chemical Formula 4-1

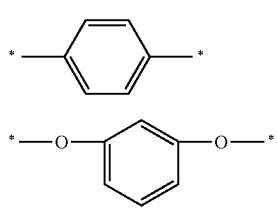

Chemical Formula 4-2

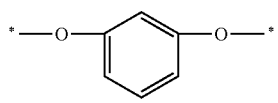

Chemical Formula 4-3

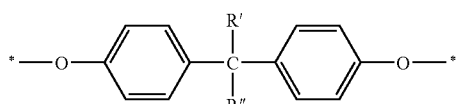

Chemical Formula 4-4

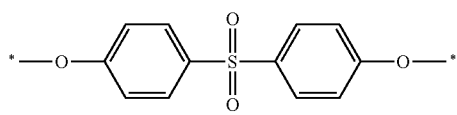

Chemical Formula 4-5

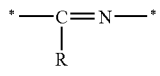

Chemical Formula 4-6

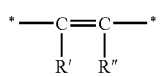

Chemical Formula 4-7

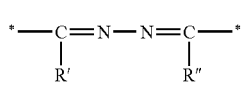

wherein in the above Chemical Formulas 4-3, 4-5, 4-6, and 4-7,
R, R' and R" are independently hydrogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, Chemical Formula 5-1

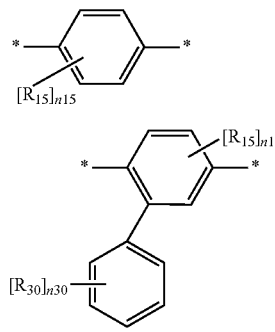

Chemical Formula 5-2

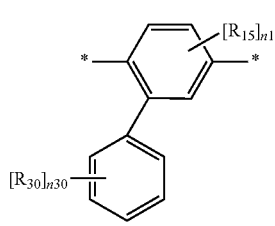

wherein in the above Chemical Formula 5-2,
$n_{15}$ is an integer ranging from 0 to 4, $n_{30}$ is an integer ranging from 0 to 5,
$R_{15}$ and $R_{30}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ and $n_{30}$ are 2 or more, the substituents are the same or different, and
the aromatic cyclic group includes a heteroatom selected from N, O, S, or P, Chemical Formula 5-3

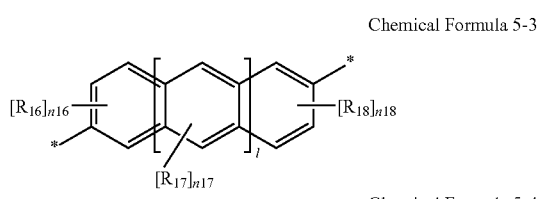

Chemical Formula 5-4

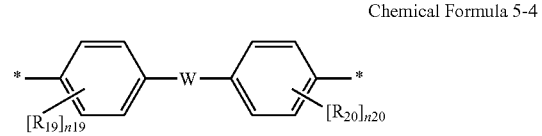

wherein in the above Chemical Formula 5-1, 5-3 and 5-4,
$n_{15}$ to $n_{20}$, $n_{30}$, $R_{15}$ to $R_{20}$, $R_{30}$, and W are the same as defined in the above Chemical Formula 3-1 to 3-5.

2. The thermosetting resin composition of claim 1, wherein the repeating unit represented by the above Chemical Formula 2 or the above Chemical Formula 6 comprises any of repeating units represented by the following Chemical Formulas 7-1 to 7-3:

Chemical Formula 7-1

Chemical Formula 7-2

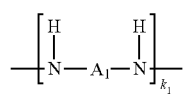

Chemical Formula 7-3

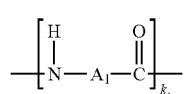

in the above Chemical Formulas 7-1 to 7-3,
$A_1$ is the same as defined in the above Chemical Formula 2 or the above Chemical Formula 6, and k is an integer ranging from 1 to 50.

3. The thermosetting resin composition of claim 1, wherein $Z_1$ and $Z_2$ in Chemical Formula 1 are independently selected from thermosetting functional groups represented by the following Chemical Formulas 8-1 to 8-11:

Chemical Formula 8-1

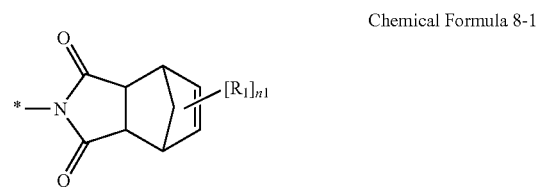

wherein in the above Chemical Formula 8-1,
$n_1$ is an integer ranging from 0 to 6, and
$R_1$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_1$ is 2 or more, the substituent is the same or different from each other,

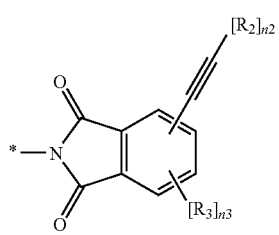

Chemical Formula 8-2 wherein in the above Chemical Formula 8-2,
$n_2$ is 1, $n_3$ is an integer ranging from 0 to 3, and
$R_2$ and $R_3$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, when $n_3$ is 2 or more, the substituents are the same or different from each other,

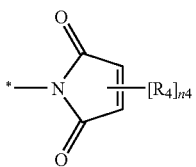

Chemical Formula 8-3 wherein in the above Chemical Formula 8-3,
$n_4$ is an integer ranging from 0 to 2, and
$R_4$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_4$ is 2 or more, the substituent is the same or different from each other,

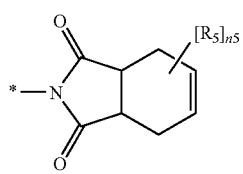

Chemical Formula 8-4 wherein in the above Chemical Formula 8-4,
$n_5$ is an integer ranging from 0 to 8, and
$R_5$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_5$ is 2 or more, the substituent is the same or different from each other,

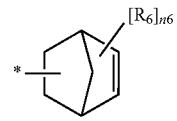

Chemical Formula 8-5 wherein in the above Chemical Formula 8-5,
$n_6$ is an integer ranging from 0 to 7, and
$R_6$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_6$ is 2 or more, the substituent is the same or different from each other,

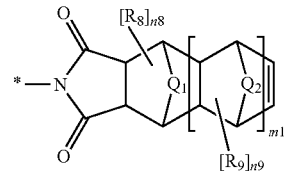

Chemical Formula 8-6 wherein in the above Chemical Formula 8-6,
$n_8$ and $n_9$ are independently integers ranging from 0 to 6,
$R_8$ and $R_9$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when each $n_8$ and $n_9$ are 2 or more, the substituents are the same or different from each other,
$Q_1$ and $Q_2$ are independently methylene, O, or S, and
$m_1$ is an integer ranging from 1 to 3,

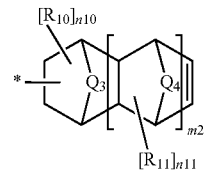

Chemical Formula 8-7 wherein in the above Chemical Formula 8-7,
$n_{10}$ is an integer ranging from 0 to 7, $n_{11}$ is an integer ranging from 0 to 6,
$R_{10}$ and $R_{11}$ are independently substituents selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{10}$ and $n_{11}$ are independently 2 or more, the substituents are the same or different from each other, $Q_3$ and $Q_4$ are independently methylene, O, or S, and
$m_2$ is an integer ranging from 1 to 3,

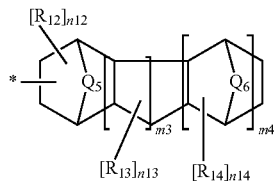

Chemical Formula 8-8 wherein in the above Chemical Formula 8-8,
$n_{12}$ is an integer ranging from 0 to 7, $n_{13}$ is an integer ranging from 0 to 6, $n_{14}$ is an integer ranging from 0 to 8,
$R_{12}$ to $R_{14}$ are independently substituents selected from y hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and $n_{12}$ to $n_{14}$ are 2 or more, the substituents are the same or different from each other,
$Q_5$ and $Q_6$ are independently methylene, O, or S, and
$m_3$ and $m_4$ are independently integers ranging from 1 to 3,

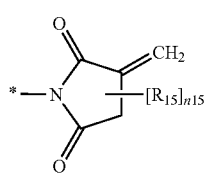

Chemical Formula 8-9 wherein in the above Chemical Formula 8-9,
$n_{15}$ is an integer ranging from 0 to 2,
$R_{15}$ is a substituent selected from hydrogen, halogen, a substituted or unsubstituted C1 to C20 alkyl, a substituted or unsubstituted C1 to C20 alkoxy, a substituted or unsubstituted C6 to C30 aryl, or a substituted or unsubstituted C6 to C30 aryloxy, and when $n_{15}$ is 2, the substituent is the same or different from each other,

Chemical Formula 8-10

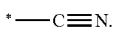

Chemical Formula 8-11

4. The thermosetting resin composition of claim 1, wherein the repeating unit represented by Chemical Formula 2 is included in an amount of more than about 5 mol % to about 70 mol % or less based on the total moles of the main chain of the thermosetting aromatic oligomer.

5. The thermosetting resin composition of claim 1, wherein the thermosetting aromatic oligomer has a number average molecular weight of about 500 to about 15,000.

6. The thermosetting resin composition of claim 5, wherein the thermosetting aromatic oligomer has a number average molecular weight of about 1,000 to about 4,000.

7. The thermosetting resin composition of claim 1, wherein the thermosetting aromatic oligomer is included in an amount of about 10 to about 75 wt % based on the total weight of the thermosetting resin composition.

8. The thermosetting resin composition of claim 1, wherein the hollow particle further comprises a porous inorganic material, a porous organic material, a porous organic-inorganic composite material, or a combination thereof, and the porous inorganic material is made using alumina, silica, fused silica, glass, or a combination thereof, and the porous organic material is made using a urea resin, a phenol resin, or a combination thereof.

9. The thermosetting resin composition of claim 1, wherein the aerogel is obtained from silica, an organic polymer, alumina, platinum, nickel, titania, zirconia, ruthenium, cobalt, or a combination thereof.

10. The thermosetting resin composition of claim 1, wherein the hollow particle is included in an amount of about 0.5 to about 70 volume % based on the total volume of the thermosetting aromatic oligomer and hollow particle.

11. The thermosetting resin composition of claim 10, wherein the hollow particle is included in an amount of about 30 to about 60 volume % based on the total volume of the thermosetting aromatic oligomer and hollow particle.

12. The thermosetting resin composition of claim 1, wherein the hollow particle has a size of about 0.1 to about 100 μm.

13. The thermosetting resin composition of claim 1, wherein the thermosetting resin composition further comprises a maleimide-based compound.

14. A resin cured product comprising the thermosetting resin composition according to claim 1.

15. A board comprising
the resin cured product according to claim 14; and
a reinforcing material,
wherein the resin cured product is impregnated into the reinforcing material and attached thereto, or disposed on the surface of the reinforcing material.

16. The board of claim 15, wherein the board further comprises a metal foil being bound with at least one side of the resin cured product.

* * * * *